United States Patent [19]

Bowers

[11] Patent Number: 4,503,381
[45] Date of Patent: Mar. 5, 1985

[54] INTEGRATED CIRCUIT CURRENT MIRROR
[75] Inventor: Derek F. Bowers, Santa Clara, Calif.
[73] Assignee: Precision Monolithics, Inc., Santa Clara, Calif.
[21] Appl. No.: 472,963
[22] Filed: Mar. 7, 1983
[51] Int. Cl.[3] .............................................. G05F 3/16
[52] U.S. Cl. .................................... 323/315; 307/297
[58] Field of Search .............. 323/312, 313, 314, 315; 307/297

[56] References Cited

U.S. PATENT DOCUMENTS

| | | | |
|---|---|---|---|
| 4,100,477 | 7/1978 | Tam | 323/314 |
| 4,103,249 | 7/1978 | Burdick | 323/315 |
| 4,329,639 | 4/1982 | Davis | 323/315 |
| 4,347,476 | 8/1982 | Tam | 323/313 |
| 4,461,992 | 7/1984 | Yamaguchi et al. | 323/313 |
| 4,464,588 | 8/1984 | Wieser | 323/313 |

Primary Examiner—Peter S. Wong
Assistant Examiner—Judson Jones
Attorney, Agent, or Firm—Koppel & Harris

[57] ABSTRACT

An integrated current mirror circuit in which a compensation transistor is added in each stage of the mirror to compensate for the base-substrate leakage currents of the other transistors in the mirror circuit and to keep the circuit operative even at high temperatures and low current levels. Each compensation transistor is matched with the other transistors in its stage and has its collector-emitter circuit connected between a voltage source terminal and the common base connection of the other transistors. The base of each compensation transistor is unconnected to the remainder of the circuit but exhibits a base-substrate leakage current which is employed in the compensation scheme.

9 Claims, 2 Drawing Figures

U.S. Patent     Mar. 5, 1985     4,503,381
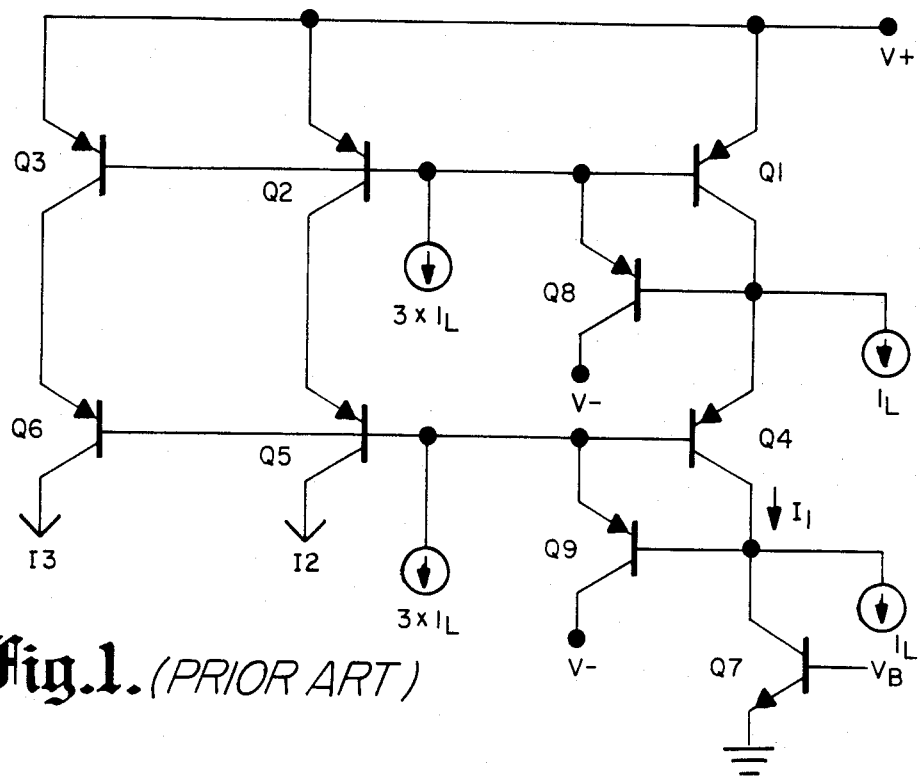
Fig.1. *(PRIOR ART)*
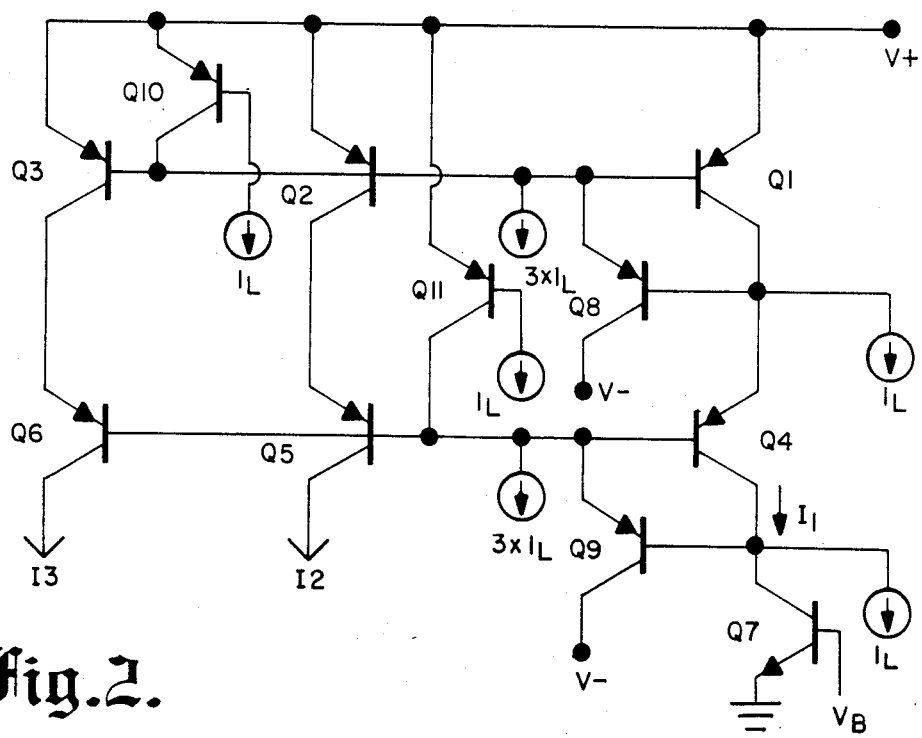
Fig.2.

INTEGRATED CIRCUIT CURRENT MIRROR

BACKGROUND OF THE INVENTION

Field of the Invention

This invention relates to integrated circuit current mirror circuits, and more particularly to current mirrors with means for compensating for the effects of current leakages to the circuit substrate.

Description of the Prior Art

It is often required, especially in bias current cancellation circuits, that very accurate low current sources be generated within an intergrated circuit. This is conventionally achieved by the use of a "current mirror" composed of lateral PNP transistors. A problem with this approach is that lateral PNP transistors of the standard bipolar type exhibit base leakage currents to the substrate which cause inaccuracies and even complete malfunction at high temperatures.

A conventional type of current mirror circuit is shown in FIG. 1. A two-stage current mirror is shown, the second stage being employed to greatly increase the output impedance of the mirror in order to limit changes in output current with changes in output termination voltage. The first stage consists of a current reference transistor Q1 which is matched and has a common base connection with a pair of slave transistors Q2 and Q3. The second stage is formed in a similar manner, with a current reference transistor Q4 matched and having a common base connection with slave transistors Q5 and Q6. The collector-emitter circuits Q4, Q5 and Q6 are connected respectively in circuit with the collector-emitter circuits of Q1, Q2 and Q3.

An NPN current source transistor Q7 has its collector-emitter circuit connected to the collector of Q4, and is biased so as to produce a desired reference current I1 which is directed through Q4 and Q1. (With a single stage current mirror Q7 would be connected directly to Q1.) The emitters of first stage transistors Q1, Q2 and Q3 are all connected in common to a positive voltage source bus, while the collectors of Q5 and Q6 provide output currents I2 and I3 which mirror I1. The circuit is shown as having two outputs, but additional outputs could be added by providing additional slave transistor pairs in the same manner as Q2/Q5 and Q3/Q6.

Current supply transistors Q8 and Q9 are provided respectively in the first and second stages to supply the base and leakage currents of the reference and slave transistors. With the exception of Q7, all of the transistors described are of the PNP type. The emitter of Q8 is connected to the common base connection of Q1, Q2, Q3, its collector is connected to a negative voltage supply terminal, and its base is connected to the collector of Q1; Q9 is similarly connected in the second stage of Q4, Q5 and Q6.

In the integrated circuit implementation of bipolar transistors such as Q1–Q9 on a substrate, each of the transistors is characterized by a base-to-substrate leakage current ($I_L$). Neglecting the leakage currents and the base currents of Q8 and Q9, and assuming that Q1–Q6 are identical (i.e., that they have the same current gain and base-emitter voltage at a given current), then the collector current of Q4 will be equal to I1, and the collector current of Q1 will be equal to I1 (1+1/b), where b is the PNP current gain. Since Q1, Q2 and Q3 are identical, Q2 and Q3 will also have collector currents equal to I1 (1+1/b). Q4, Q5 and Q6 are also identical, so that their collector currents are also equal; hence, I1=I2=I3.

The presence of Q8 and Q9 causes a small error in the current matching between the slave and reference transistors. However, this error is inversely proportional to $b^2$, and with a typical b of about 50 for PNP transistors can be neglected. A more serious problem occurs due to the base-substrate leakage of the PNP transistors, modeled as $I_L$ current sources in FIG. 1. At low temperatures this leakage current may be only a few picoamps and unlikely to cause problems, but at high temperatures of about 125° C. $I_L$ is about 1 to 2 nanoamps.

The emitter current of Q8 is equal to the combined base currents of Q1, Q2 and Q3, while the emitter current of Q9 is equal to the combined base currents of Q4, Q5 and Q6, or about 3 $I_1$/b in both cases. Since there are 3 base-substrate current leakages at the emitters of Q8 and Q9, the emitter currents of those transistors become negative if the leakage current is greater than $I_1$/b. This turns Q8 and Q9 off, and the current mirror no longer functions. In this event the output currents I2 and I3 are approximately equal to $bI_L$, and are not controlled by I1. Taking typical values for $I_L$ of 2 nanoamps and for b of 50, this turn-off situation occurs when I1 is less than 100 nanoamps.

Even if Q8 and Q9 do not turn off, their base leakage currents will cause errors at the collectors of reference current transistors Q1 and Q4. The overall error in I2 and I3 will be about $2I_L$/I1, or about 4% when $I_L$ equals 2 nanoamp and I1 equals 100 nanoamps. The base leakage current of current source Q7 introduces a further error.

SUMMARY OF THE INVENTION

In view of the above problems associated with the prior art, it is an object of this invention to provide a novel and improved current mirror circuit which alleviates the prior art problem of current supply transistor turn-off at high temperatures.

Another object is the provision of a novel and improved current mirror circuit capable of compensating for the base-substrate leakage currents of the current supply transistors.

Another object is the provision of such a current mirror circuit which also compensates for the base-substrate current leakage of the NPN current source transistor.

In the realization of these objects, a bipolar compensation transistor is connected in each stage of a conventional current mirror circuit with its collector-emitter circuit connected between the voltage supply terminal for the other stage transistors, and the common base connection of those transistors. The base of the compensation transistor is unconnected to the remainder of the current mirror circuit, and provides a leakage current to the substrate. The compensation transistor is matched with the other transistors in the current mirror so that its collector-emitter current supplied to the common base connection of the reference and slave transistors is of sufficient magnitude to maintain the current supply transistor in a conductive state, independent of the current through the reference and slave transistors.

When the compensation transistor is substantially identical to the current supply transistor, it supplies a current to the latter transistor which substantially compensates for that transistor's base leakage current. The base area of the compensation transistor can also be increased by an amount substantially equal to the collector area of the NPN current source transistor to provide an additional compensation current which compensates for the NPN transistor's collector-leakage current.

DESCRIPTION OF THE DRAWINGS

These and other objects and features of the invention will be apparent to those skilled in the art from the following detailed description of a preferred embodiment, taken together with the accompanying drawings, in which:

FIG. 1 is a schematic diagram of a prior art current mirror circuit; and

FIG. 2 is a schematic diagram of an improved current mirror circuit designed in accordance with the present invention.

DETAILED DESCRIPTION OF A PREFERRED EMBODIMENT

FIG. 2 is a schematic diagram of an integrated circuit current mirror circuit which incorporates the present invention. The basic elements of this two-stage current mirror, comprising reference current transistors Q1 and Q4, slave transistors Q2, Q3, Q5 and Q6, current source transistor Q7 and current supply transistors Q8 and Q9, are the same as in the prior art current mirror circuit depicted in FIG. 1, and are identified by the same reference numerals. In addition, the circuit of FIG. 2 shows a unique way of alleviating the problems of both current supply transistor turn-off at high temperatures, and of errors due to the base-substrate leakage currents of the current supply transistors. The solution of these problems requires the addition of only two extra transistors, one for each stage of the mirror. Bipolar PNP transistor Q10 is added to the first stage and is matched with the other transistors Q1, Q2, Q3, Q8 of that stage, while bipolar PNP transistor Q11 is added to the second stage and is matched with the other transistors Q4, Q5, Q6, Q9 of that stage. Q10 has its emitter connected to the positive voltage supply terminal and its collector connected to the common base connection of Q1, Q2 and Q3. Its base is unconnected to the remainder of the current mirror circuit, but exhibits the same leakage current $I_L$ as the other transistors in the stage. Similarly, the emitter of Q11 is connected to the positive voltage supply terminal, while its collector is connected to the common base connection of Q4, Q5 and Q6. The base of Q11 is also unconnected to the remainder of the current mirror circuit, and also exhibits a base-substrate leakage current $I_L$.

Due to the matching with the other transistors, the collector currents of Q10 and Q11 are equal to $bI_L$, where b is the common current gain characteristic of all the PNP transistors. The collector currents of Q10 and Q11 flow through the common base connections of their respective stages and into the emitters of Q8 and Q9, respectively. Q8 and Q9 already support the base currents and the base-substrate leakage currents of Q1, Q2, Q3 and Q4, Q5, Q6, respectively. These currents may be expressed as $-3I_L + 3I1/b$ for each transistor. The addition of the collector currents of Q10 and Q11 brings the emitter currents of Q8 and Q9 to $bI_L - 3I_L + 3I1/b$. If b is greater than 3, which is almost always the case, the emitter currents of Q8 and Q9 remain positive independent of I1 or $I_L$, preventing Q8 and Q9 from turning off. This effectively solves the turn-off problem described above.

Since the $(-3I_L + 3I1/b)$ components of the Q8 and Q9 emitter currents are generally small compared to the $bI_L$ current component from compensation transistors Q10 and Q11, the base currents of Q8 and Q9 are approximately equal to $bI_L/b$, or $I_L$. This current is of the same magnitude but opposite polarity to the base-leakage currents at the bases of Q8 and Q9. A first order cancellation of those base-leakage currents is thus achieved. The addition of compensation transistors Q10 and Q11 thus resolves to a great extent both the current supply transistor turn-off and base-substrate leakage current error problems. The described circuit has been found to be capable of operating with currents below 10 nanoamps at a temperature of 125° C. without encountering the turn-off problem.

Additional current outputs can be generated in the circuit of FIG. 2 by adding transistor pairs connected in a similar manner to Q2/Q5 and Q3/Q6. A practical limit is reached, however, when the emitter currents of Q8 and Q9 become high enough for their base currents to produce a significant error.

The above circuit can also significantly reduce an error factor associated with NPN current source transistor Q7. Reference current I1 is generated at the collector of Q7, but Q7 will have its own substrate leakage current which is added to the collector current of Q4, causing an error. This error can be compensated by increasing the base area of Q11 by an amount equal to the collector area of Q7. This adds an extra $I_L$ to the base current of Q9 which approximately cancels the leakage current of Q7.

While a specific embodiment of the invention has been shown and described, numerous variations and modifications thereof will occur to those skilled in the art. For example, the invention is applicable to a single stage current mirror as well as the two-stage mirror described. Accordingly, it is intended that the invention be limited only in terms of the appended claims.

I claim:

1. In an integrated circuit current mirror circuit formed on a substrate and including a bipolar reference current transistor, current source means directing a reference current through the collector-emitter circuit of the reference transistor, at least one bipolar slave transistor, the reference current and slave transistors each being characterized by base-substrate leakage currents and having a common base connection and their collector-emitter circuits connected in circuit with a voltage source terminal of a first polarity, and a bipolar current supply transistor with its collector-emitter circuit connected between said common base connection and a voltage supply terminal of a second polarity to supply the base and leakage currents of the reference and slave transistors, said current supply transistor also characterized by a base-substrate leakage current, the improvement comprising:

a bipolar compensation transistor having its collector-emitter circuit connected between a voltage supply terminal of said first polarity and said common base connection, and its base unconnected to the remainder of the current mirror circuit and providing a leakage current to the substrate, said compensation transistor supplying its collector-emitter current to the common base connection and thereby to the collector-emitter circuit of the current supply transistor, said compensation transistor being configured to provide a collector-emitter current of sufficient magnitude to maintain the current supply transistor in a conductive state at elevated temperatures independent of the current through the reference and slave transistors.

2. The current mirror circuit of claim 1, said compensation transistor being matched with the current supply transistor, whereby the current provided by the compensation transistor to the current supply transistor substantially compensates for the current supply transistor's base-substrate leakage current.

3. The current mirror circuit of claim 2, said reference current, slave, current supply and compensation transistors comprising PNP transistors, said current source means comprising an NPN transistor having its collector connected to the base of the current supply transistor and biased to produce a desired reference current, said NPN transistor being characterized by a collector-substrate leakage current, wherein the base area of the compensation transistor is increased by an amount substantially equal to the collector area of the NPN transistor, thereby providing an additional compensation current to substantially compensate for the NPN transistor leakage current.

4. In an integrated circuit current mirror circuit formed on a substrate and having a first bipolar reference transistor, current source means directing a reference current through the collector-emitter circuit of the first reference transistor, at least one first bipolar slave transistor matched with and having a common base connection with the first reference transistor to mirror the collector-emitter current therein, and a voltage source terminal connected in circuit with the first reference and slave transistors, the improvement comprising:
 a first bipolar compensation transistor matched with the first reference and slave transistors and having its collector-emitter circuit connected in circuit between the voltage source terminal and the common base connection, and its base unconnected to the remainder of the current mirror and providing a current leakage path to the substrate to compensate for the base-substrate current leakage of the first reference and slave transistors.

5. The current mirror circuit of claim 4, further comprising a second current mirror stage having a second bipolar reference transistor and at least one second bipolar slave transistor connected to the collector-emitter circuits of the first reference transistor and first slave transistors, respectively, the second slave transistors having a common base connection with the second reference transistor to provide output currents mirroring the collector-emitter current therein, said current source directing a reference current through the collector-emitter circuits of the first and second reference transistors, wherein a second bipolar compensation transistor is provided which is matched with the second reference and slave transistors and has its collector-emitter circuit connected in circuit between the voltage source terminal and the common base connection of the second reference and slave transistors, the base of the second compensation transistor being unconnected to the remainder of the current mirror and providing a current leakage path to the substrate to compensate for the base-substrate current leakage of the second reference and slave transistors.

6. In an integrated circuit current mirror circuit formed on a substrate and including a first reference transistor having a collector, an emitter and a base, a current source directing a reference current through the collector-emitter circuit of the first reference transistor, at least one first slave transistor having a collector, an emitter and a base, said slave transistors being matched with and having a common base connection with the reference transistor, a first voltage source terminal connected to one end of the collector-emitter circuits of the reference and slave transistors, the other end of the reference transistor collector-emitter circuit connected to the current source, the other ends of the slave transistor collector-emitter circuits providing current outputs mirroring the current source, a second voltage source terminal, and a first current supply transistor matched with the reference and slave transistors and having a collector-emitter circuit connected between said common base connection and the second voltage source terminal and a base connected in circuit with the current source and the collector-emitter circuit of the reference transistor, each of said reference and slave transistors being characterized by base-substrate leakage currents, said current supply transistor supplying the base and leakage currents of the reference and slave transistors, the improvement comprising:
 a compensation transistor having a collector-emitter circuit connected between the first voltage source terminal and the collector-emitter circuit of the first current supply transistor, and a base which is unconnected to the remainder of the current mirror circuit, said compensation transistor having a base-substrate leakage current and a current gain characteristic which yield a collector-emitter current therein which is greater than the other components of the current supply transistor's collector-emitter current within a predetermined temperature range, and being oriented to provide current to the current supply transistor to maintain that transistor in a conductive state within said temperature range.

7. The current mirror circuit of claim 6, wherein the compensation transistor is matched with the current supply transistor and has a current gain characteristic substantially greater than the total number of reference and slave transistors, whereby the compensation transistor approximately compensates for the base current of the current supply transistor.

8. The current mirror circuit of claim 6, further comprising a second current mirror stage including a second reference transistor and at least one second slave transistor each having respective collectors, emitters and bases and connected to the collector-emitter circuits of the first reference transistor and first slave transistors, respectively, the second slave transistors being matched with and having a common base connection with the second reference transistor to provide output currents mirroring the collector-emitter current therein, said current source directing a reference current through the collector-emitter circuits of the first and second reference transistors, and a second current supply transistor matched with the second reference and slave transistors and having a collector-emitter circuit connected between the second reference and slave transistor common base connection and the second voltage source terminal, and a base connected in circuit with the current source and the collector-emitter circuit of the second reference transistor, each of said second reference and slave transistors being characterized by base-substrate leakage currents, said second current supply transistor supplying the base and leakage currents of the reference and slave transistors, said improvement further comprising:

a second compensation transistor having a collector-emitter circuit connected between the first voltage source terminal and the collector-emitter circuit of the second current supply transistor, and a base which is unconnected to the remainder of the current mirror circuit, said second compensation transistor having a base-substrate leakage current and a current gain characteristic which yield a collector-emitter current therein which is greater than the other components of the second current supply transistor's collector-emitter current within a predetermined temperature range, and being oriented to provide current to the second current supply transistor to maintain that transistor in a conductive state within said temperature range.

9. The current mirror circuit of claim 8, wherein the first and second compensation transistors are respectively matched with the first and second current supply transistors and have current gains substantially greater than the total number of first or second reference and slave transistors, whereby the first and second compensation transistors approximately compensate for the base currents of the first and second current supply transistors, respectively.

* * * * *